(12) United States Patent
Tsou et al.

(10) Patent No.: US 7,936,124 B2
(45) Date of Patent: May 3, 2011

(54) ORGANIC LIGHT EMITTING DIODE DEVICE WITH BRIGHTNESS UNIFORMITY DESIGN

(75) Inventors: Chung Che Tsou, Taoyuan County (TW); Shin Ju Lin, Taichung (TW)

(73) Assignee: Ritdisplay Corporation, Hsinchu (TW)

( * ) Notice: Subject to any disclaimer, the term of this patent is extended or adjusted under 35 U.S.C. 154(b) by 740 days.

(21) Appl. No.: 11/777,824

(22) Filed: Jul. 13, 2007

(65) Prior Publication Data
US 2008/0042560 A1 Feb. 21, 2008

(30) Foreign Application Priority Data
Aug. 16, 2006 (TW) .............................. 95130054 A

(51) Int. Cl.
*H05B 33/06* (2006.01)
*H05B 33/00* (2006.01)

(52) U.S. Cl. ........ 313/505; 313/500; 313/504; 313/506; 315/169.3

(58) Field of Classification Search .......... 313/504–506, 313/500
See application file for complete search history.

(56) References Cited

U.S. PATENT DOCUMENTS

| | | | | |
|---|---|---|---|---|
| 4,401,370 A * | 8/1983 | Miyazaki et al. | ............. | 359/271 |
| 6,111,357 A * | 8/2000 | Fleming et al. | ............... | 313/509 |
| 6,496,168 B1 * | 12/2002 | Tomida | ........................... | 345/76 |
| 6,686,693 B1 * | 2/2004 | Ogawa | .......................... | 313/505 |
| 6,833,671 B2 * | 12/2004 | Peng | .............................. | 313/506 |
| 7,028,898 B2 * | 4/2006 | Chang | ........................... | 235/454 |
| 2006/0028124 A1 * | 2/2006 | Chu et al. | ....................... | 313/504 |
| 2008/0030127 A1 * | 2/2008 | Tsou et al. | ...................... | 313/504 |

FOREIGN PATENT DOCUMENTS

| KR | 2002023026 A | * | 3/2002 |
|---|---|---|---|
| SU | 547981 A | * | 7/1977 |

OTHER PUBLICATIONS

Machine English translation of KR 2002023026 to Chae et al.*
English abstract of SU 547981 a to Avetisova.*

* cited by examiner

*Primary Examiner* — Sikha Roy
(74) *Attorney, Agent, or Firm* — WPAT, P.C.; Anthony King

(57) ABSTRACT

An organic light emitting device (OLED) with brightness uniformity design comprises a substrate, an anode layer, a light emitting layer, a cathode layer, a plurality of anode leads and a plurality of cathode leads. The anode layer has a plurality of separate regions formed on the substrate respectively; the light emitting layer has a plurality of separate regions formed on the plurality of anode layer regions respectively; the cathode layer has a plurality of separate regions formed on the plurality of light emitting layer regions respectively. The anode leads with different cross-sectional areas are respectively connected to the regions of the anode layer, and the cathode leads with different cross-sectional areas are respectively connected to the regions of the cathode layer; the anode leads are connected to a positive input terminal of a power supply, and the cathode leads are connected to a negative input terminal of the power supply. The ratios of the lengths to the cross-sectional areas of the anode leads and cathode leads are the same, such that the currents flowing through the regions of the light emitting layer are the same.

12 Claims, 10 Drawing Sheets

ORGANIC LIGHT EMITTING DIODE DEVICE WITH BRIGHTNESS UNIFORMITY DESIGN

BACKGROUND OF THE INVENTION

1. Field of the Invention

The present invention relates to an organic light emitting diode (OLED) device, and more particularly, to an OLED device with brightness uniformity design.

2. Description of the Related Art

FIG. 1(a) is a schematic top view of a conventional organic light emitting diode device 10. FIG. 1(b) is a cross-sectional view of the organic light emitting diode device 10 in FIG. 1(a) taken along a section line A-A and rotated 180 degrees. Thus, the transparent substrate 11 is at the lower part of the figure. Moreover, the anode layer 13 in FIG. 1(b) is also made of transparent materials, so it is not shown in FIG. 1(a).

As shown in FIG. 1(b), the organic light emitting diode device 10 mainly includes a substrate 11, an anode layer 13, a light emitting layer 15, a cathode layer 17, an anode lead 12 and a cathode lead 16. The anode layer 13 is formed on the substrate 11, the light emitting layer 15 is formed on the anode layer 13, the cathode layer 17 is formed on the light emitting layer 15, the anode wire 12 is connected to the anode layer 13, and the cathode wire 16 is connected to the cathode layer 17.

As shown in FIG. 1(a), the anode lead 12 is connected to a positive input terminal of a power supply, and the cathode lead 16 is connected to a negative input terminal of the power supply. Because the light emitting layer 15 is driven by a current that varies depending upon the resistance values of the anode wire 12 and the cathode lead 16, the brightness of the emitted lights at the region of the light emitting layer 15 farthest away from the positive and negative input terminals of the power supply is darkest, as the resistance value of the lead that the current flows through is largest. The brightness of the emitted lights at the light emitting layer 15 region nearest to the positive and negative input terminals of the power supply is the brightest, because the resistance value of the lead that the current flows through is smallest. Thus, the brightness uniformity of the light emitting layer 15 is inadequate, and thereby the light emitting quality of the OLED device 10 is reduced and the application scope of the OLED device 10 is narrowed.

SUMMARY OF THE INVENTION

A main objective of the present invention is to provide an OLED device with brightness uniformity, which is capable of eliminating the problem of poor brightness uniformity for the light emitting layer, and thereby enhancing the display quality.

The organic light emitting diode device in a first embodiment of the present invention mainly comprises a substrate, an anode layer, a light emitting layer, a cathode layer, a plurality of anode leads and a plurality of cathode leads. The anode layer has a plurality of regions separated from each other and formed on the substrate respectively; the light emitting layer has a plurality of regions separated from each other and formed on the plurality of anode layer regions respectively; the cathode layer has a plurality of regions separated from each other and formed on the plurality of light emitting layer regions respectively; the plurality of anode leads with different cross-sectional areas are respectively connected to the regions of the anode layer, and the plurality of cathode leads with different cross-sectional areas are respectively connected to the regions of the cathode layer; the plurality of anode leads is connected to a positive input terminal of a power supply, and the plurality of cathode leads are connected to a negative input terminal of the power supply. The ratios of the lengths to the cross-sectional areas for the plurality of anode wires and cathode wires are the same, such that the densities of the currents flowing through the regions of the light emitting layer are the same.

The organic light emitting diode device in a second embodiment of the present invention mainly comprises a substrate, an anode layer, a light emitting layer, a cathode layer, a plurality of anode leads and a plurality of cathode leads. The anode layer has a plurality of regions separated from each other and formed on the substrate respectively; the light emitting layer has a plurality of regions separated from each other and formed on the plurality of anode layer regions respectively; the cathode layer has a plurality of regions separated from each other and formed on the plurality of light emitting layer regions respectively. The plurality of anode leads with the same cross-sectional area are respectively connected to the regions of the anode layer, and the plurality of cathode leads with the same cross-sectional area are respectively connected to the regions of cathode layer; the plurality of anode leads are respectively connected to positive input terminals of a plurality of power supplies, and the plurality of cathode leads are respectively connected to negative input terminals of the plurality of power supplies. The magnitude of one of the power supplies is in direct proportion to the length of each of the anode leads and cathode leads that is connected to the one, such that the densities of the currents flowing through the regions of the light emitting layer are the same.

The organic light emitting device in a third embodiment of the present invention comprises a substrate, an anode layer, a metal layer, a light emitting layer, a cathode layer, an anode lead and a cathode lead. The anode layer is formed on the substrate, the metal layer is formed on the anode layer, the light emitting layer is formed on the anode layer and covers the metal layer, the cathode layer is formed on the light emitting layer, the anode lead is connected to the anode layer, and the cathode lead is connected to the cathode layer. The metal layer shades a part of the light emitting region of the light emitting layer, and divides the light emitting layer into a plurality of effective light emitting areas. The aperture ratios of the light emitting regions for the light emitting layer relatively far away from the positive and negative input terminals of the power supply are compensated by adjusting the dimensions of the effective light emitting areas to be in direct proportion to the distance between the effective light emitting regions and input terminals of a power supply.

The differences between the fourth embodiment and the above embodiments of the present invention lies in that the positive input terminals and the negative input terminals of the power supply are respectively located on diagonal and opposite edges, such that the resistance values of the leads at different current paths can be approximately the same. Therefore, the brightness of the light emitting layer may be uniform.

BRIEF DESCRIPTION OF THE DRAWINGS

The invention will be described according to the appended drawings in which.

PREFERRED EMBODIMENT OF THE PRESENT INVENTION

Figure 1A:
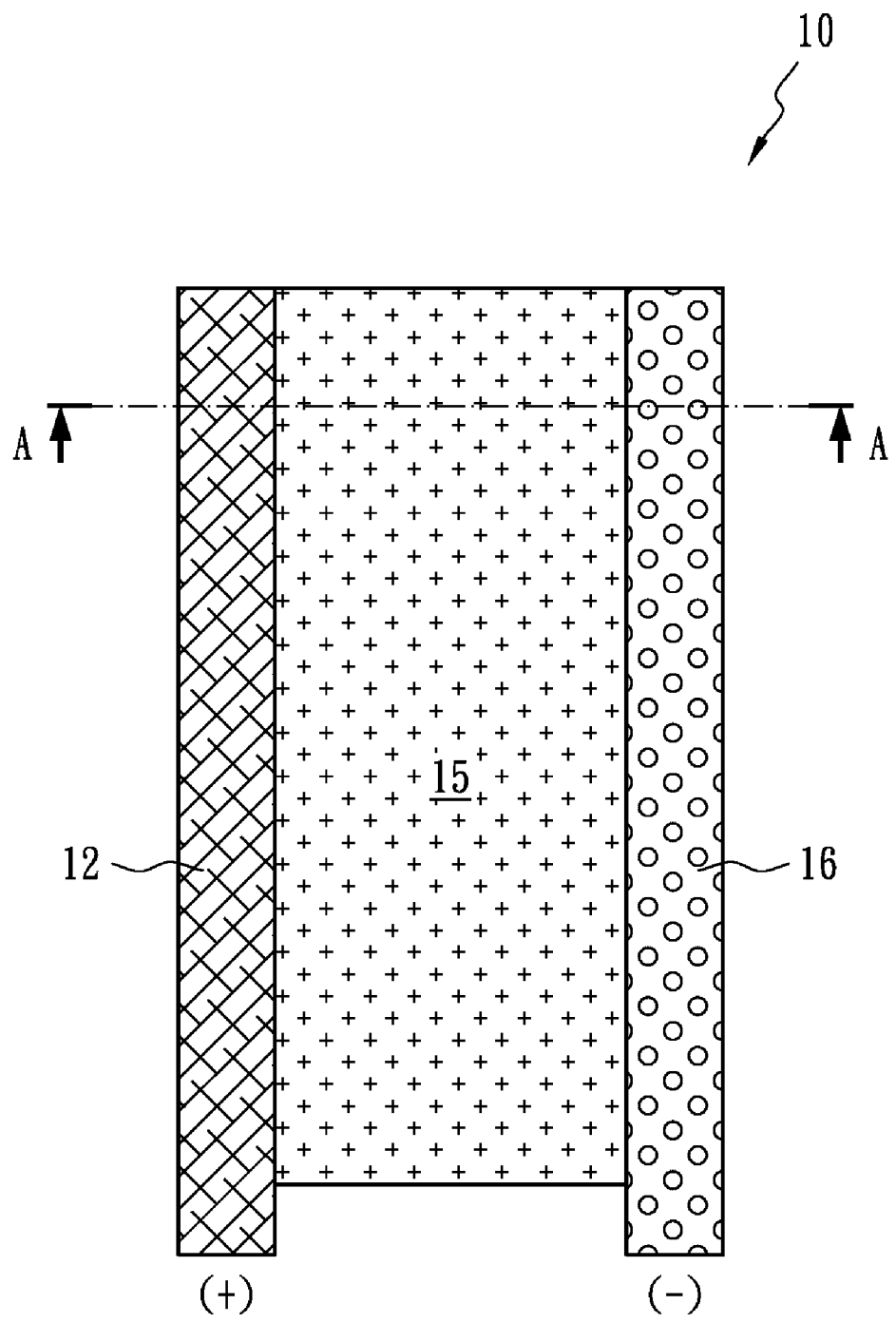
FIG. 1(a) is a schematic top view of a conventional organic light emitting diode device.
Figure 1B:
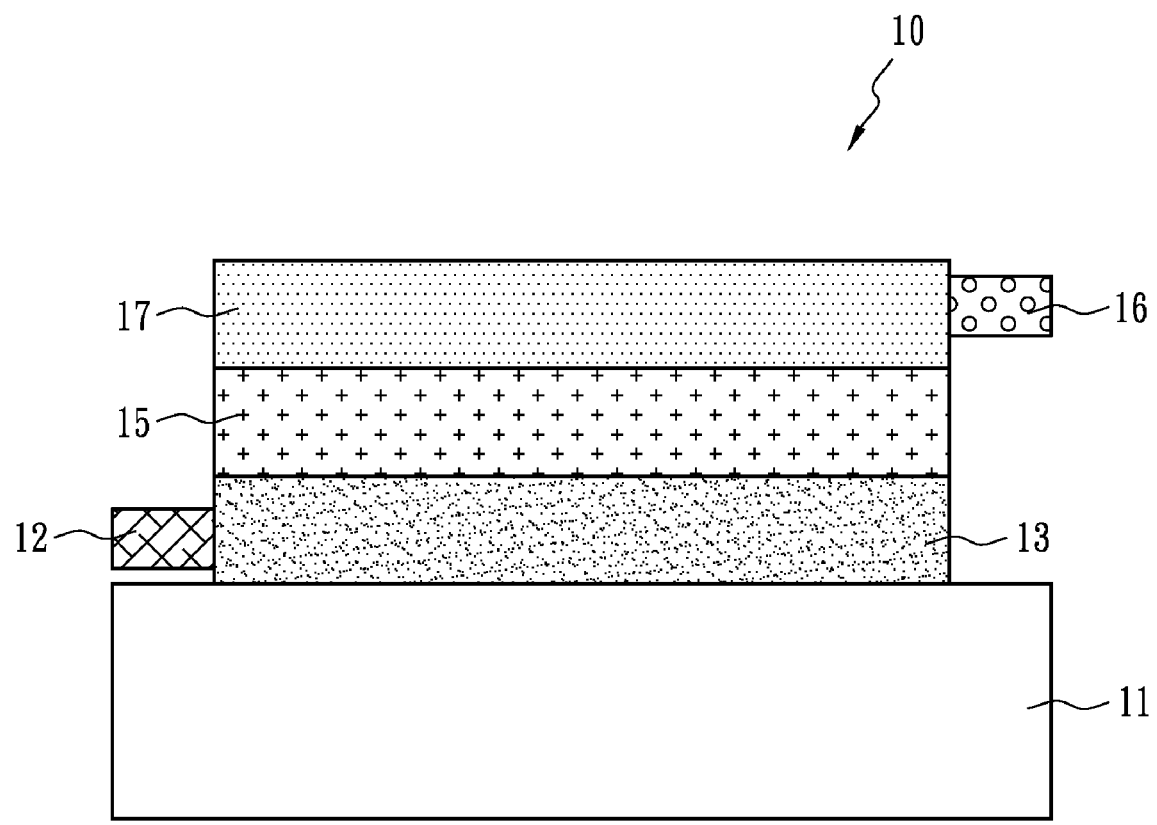
FIG. 1(b) is a cross-sectional view of the organic light emitting diode device in FIG. 1(a)
Figure 2A:
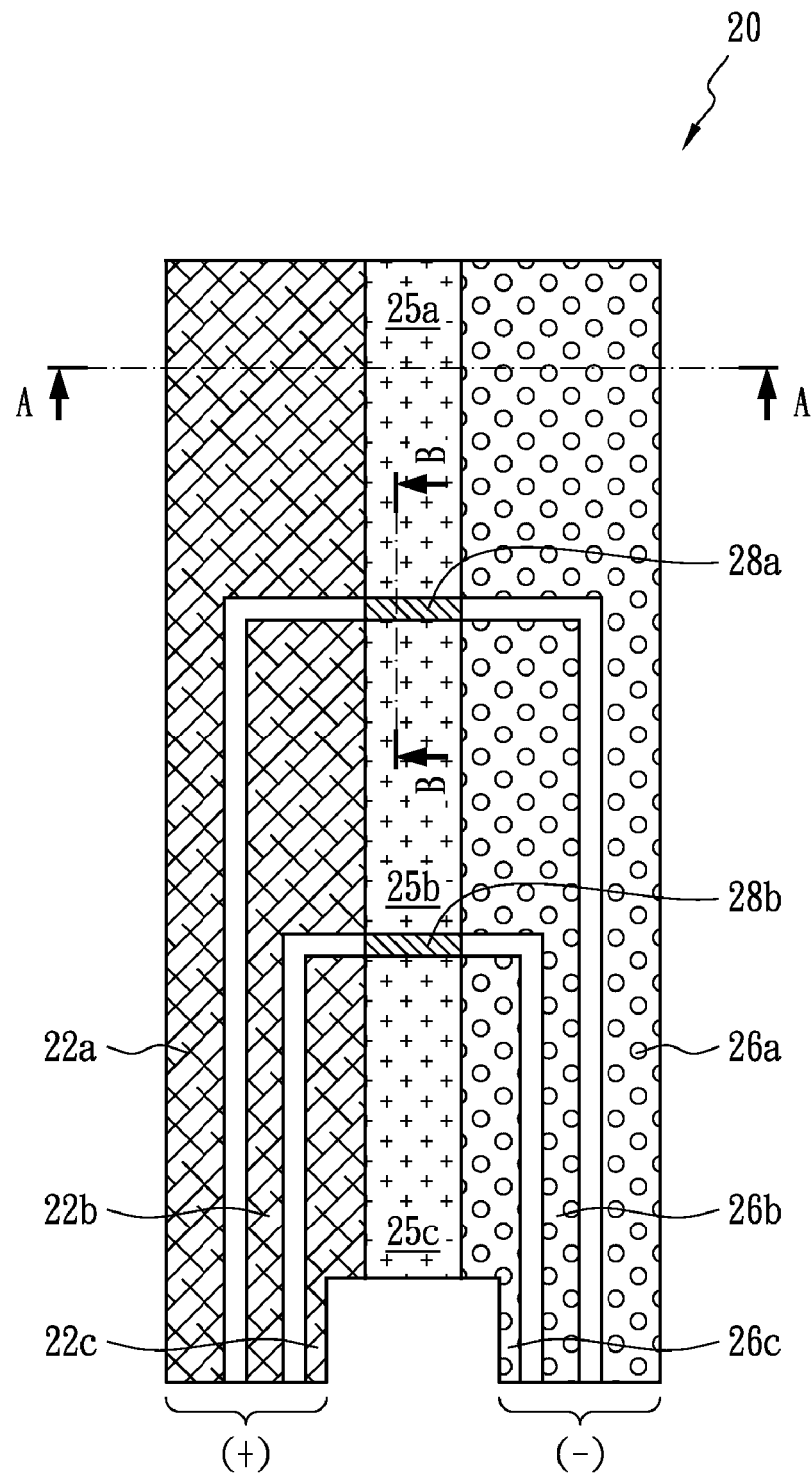
FIG. 2(a) is a schematic top view of the organic light emitting diode device according to a first embodiment of the present invention.

FIG. 2(a) is a schematic top view of an OLED device 20 with brightness uniformity design according to a first embodiment of the present invention.

Figure 2B:
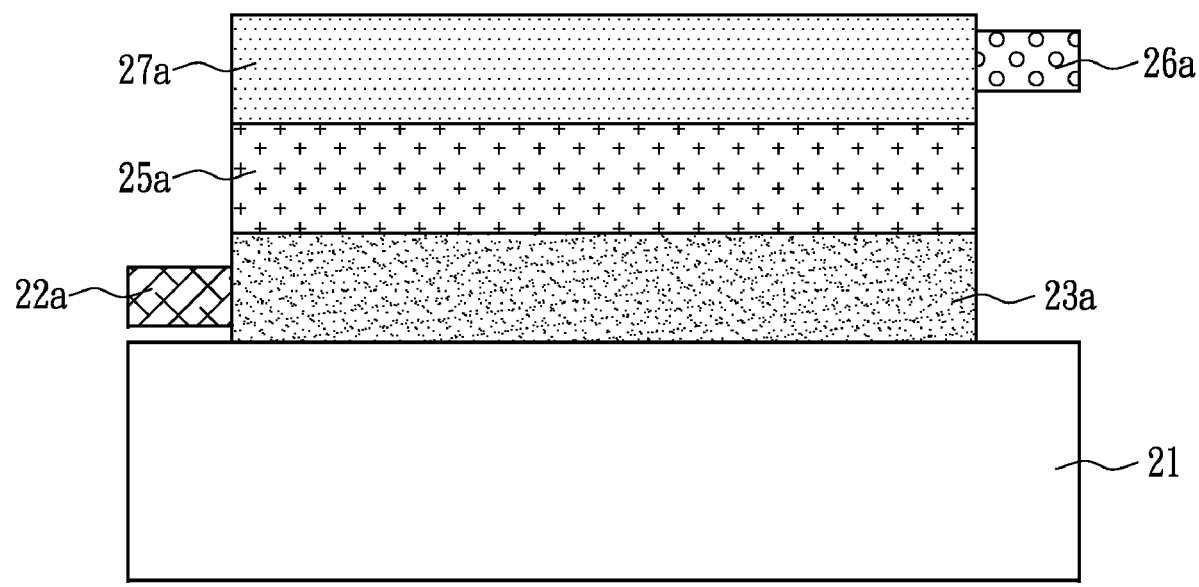
FIG. 2(b) is a cross-sectional view of the OLED device in FIG. 2(a)

FIG. 2(b) is a cross-sectional view of the OLED device 20 in FIG. 2(a) taken along a section line A-A and rotated 180 degrees. Thus, the transparent substrate 21 is at the lower part of the figure. Moreover, the anode layer 23a in FIG. 2(b) is also made of transparent materials, so it is not shown in FIG. 2(a).

As shown in FIG. 2(b), the organic light emitting diode device 20 mainly includes a substrate 21, an anode layer 23a, a light emitting layer region 25a, a cathode layer 27a, an anode wire 22a, and a cathode wire 26a. The anode layer 23a is formed on the substrate 21, the light emitting layer 25a is formed on the anode layer 23a, the cathode layer 27a is formed on the light emitting layer 25a, the anode wire 22a is connected to the anode layer 23a, and the cathode wire 26a is connected to the cathode layer 27a.

Figure 2C:
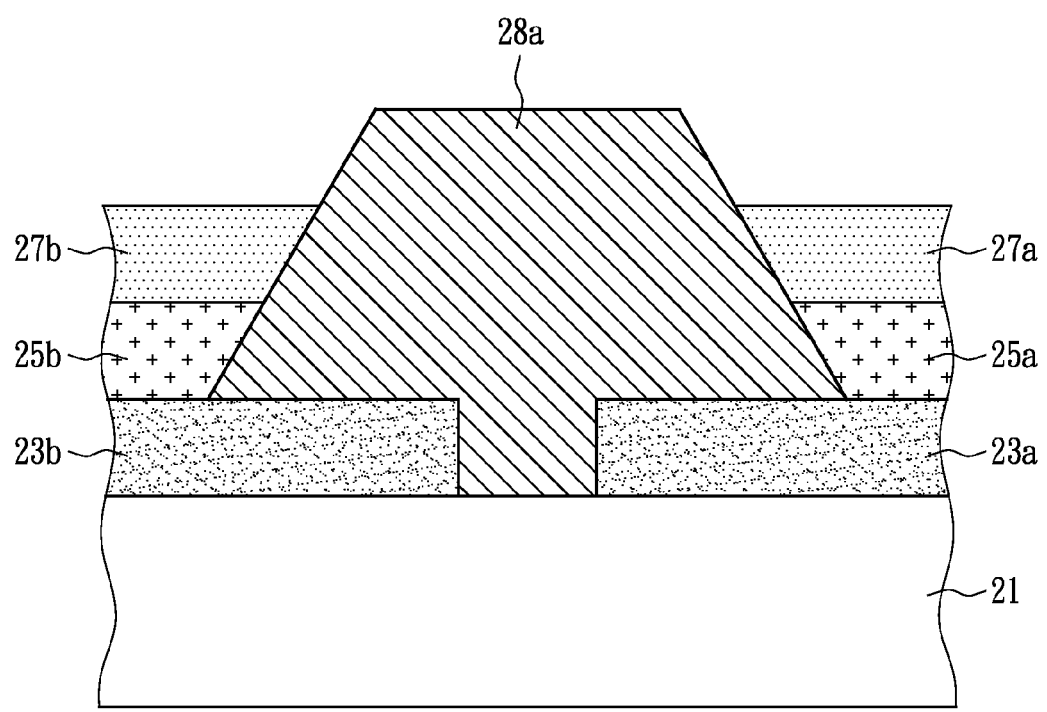
FIG. 2(c) is a cross-sectional view of the OLED device in FIG. 2(a)

FIG. 2(c) is a cross-sectional view of the OLED device 20 in FIG. 2(a) taken along a section line B-B and rotated 180 degrees, so the transparent substrate 21 is at the lower part of the figure.

As shown in FIG. 2(a), the OLED device 20 includes three separate light emitting layer regions 25a, 25b, and 25c, wherein the light emitting layer regions 25a and 25b are separated by an insulating layer 28a. As shown in FIG. 2(c), the insulating layer 28a separates the anode layer 23a from the anode layer 23b, and separates the cathode layer 27a from the cathode layer 27b, such that the light emitting layer regions 25a and 25b operate separately. The light emitting layer regions 25b and 25c are separated by an insulating layer 28b. The anode wire 22a and the cathode wire 26a are used to supply the current required for operating the light emitting layer region 25a. The anode wire 22a is connected to the positive input terminal of the power supply, and the cathode wire 26a is connected to the negative input terminal of the power supply. As shown in FIG. 2(b), the anode wire 22a is connected to the anode layer 23a, the cathode wire 26a is connected to the cathode layer 27a, so the current provided by the power supply flows from the anode wire 22a to the anode layer 23a, and then flows through the light emitting layer region 25a, and finally flows through the cathode layer 27a to the cathode wire 26a. Similarly, the anode wire 22b and the cathode wire 26b are used to supply the current required for operating the light emitting layer region 25b. The anode wire 22b is connected to the positive input terminal of the power supply, and the cathode wire 26b is connected to the negative input terminal of the power supply. The anode wire 22c and the cathode wire 26c are used to supply the current required for operating the light emitting layer region 25c. The anode wire 22c is connected to the positive input terminal of the power supply, and the cathode wire 26c is connected to the negative input terminal of the power supply.

Since the anode wires 22a, 22b, and 22c are connected to the same power supply, the current is in inverse proportion to the resistance of the wire, the resistance of the wire is in direct proportion to the length of the wire, and is in inverse proportion to the cross-sectional area of the wire. Therefore, in order to make the currents flowing through the light emitting layer regions 25a, 25b, and 25c be the same, the resistances of the anode wires 22a, 22b, and 22c need to be the same, and the resistances of the cathode wires 26a, 26b, and 26c also need to be the same. In other words, the ratio of the length to the cross-sectional area for each of the anode wires 22a, 22b, and 22c needs to be the same, and the ratio of the length to the cross-sectional area for each of the cathode wires 26a, 26b, and 26c also needs to be the same.

Figure 3:
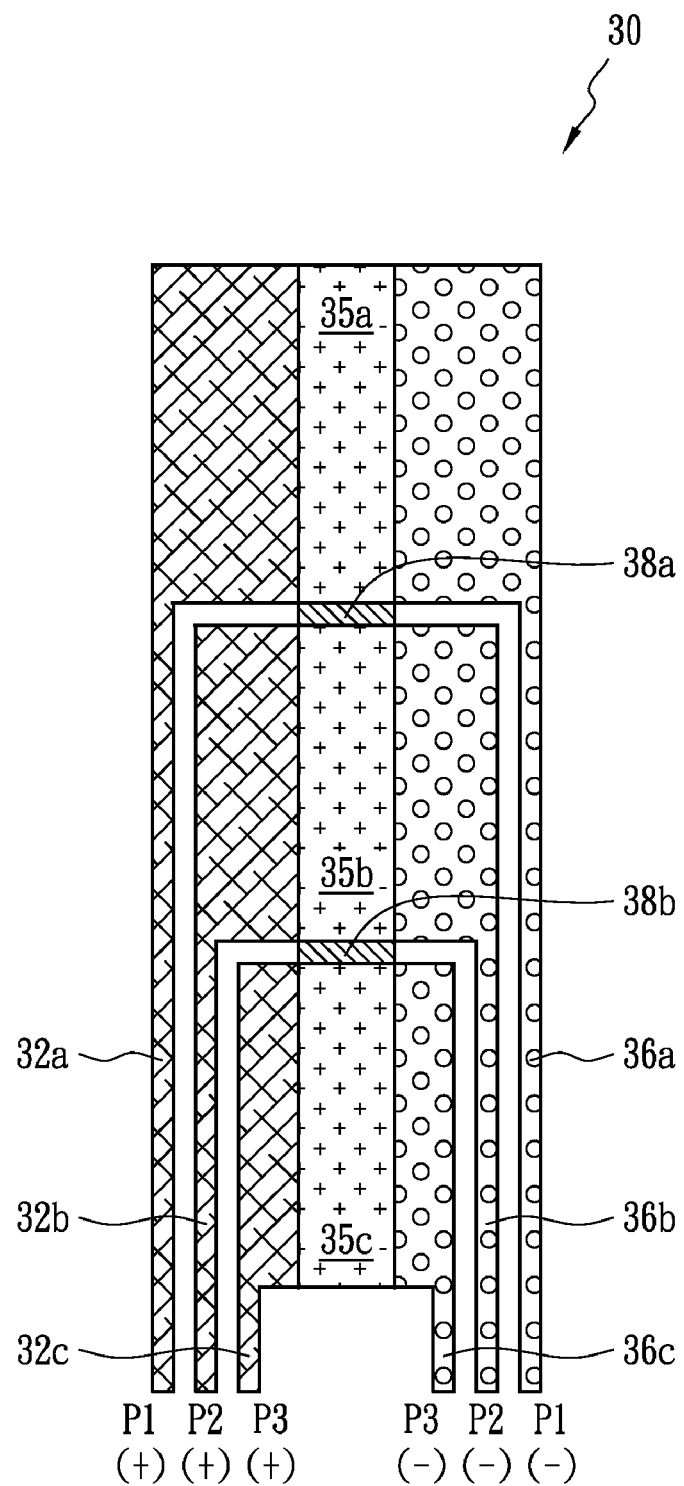
FIG. 3 is a schematic top view of the OLED device according to a second embodiment of the present invention.

FIG. 3 is a schematic top view of an OLED device 30 with brightness uniformity design in accordance with a second embodiment of the present invention. The light emitting layer regions 35a and 35b are separated by an insulating layer 38a, and the light emitting layer regions 35b and 35c are separated by an insulating layer 38b. The anode wire 32a of the OLED 30 is connected to a positive input terminal of a power supply P1, and the cathode wire 36a is connected to a negative input terminal of the power supply P1; the anode wire 32b of the OLED device 30 is connected to a positive input terminal of a power supply P2, and the cathode wire 36b is connected to a negative input terminal of the power supply P2; and the anode wire 32c of the OLED device 30 is connected to a positive input terminal of a power supply P3, and the cathode wire 36c is connected to a negative input terminal of the power supply P3. The lengths of the anode wires 32a, 32b, and 32c in this embodiment are sequentially less (32a>32b>32c), but the cross-sectional areas are the same. Therefore, the resistances of the anode wires 32a, 32b, and 32c are sequentially smaller (32a>32b>32c). Similarly, the resistances of the cathode wires 36a, 36b, and 36c are also sequentially smaller (36a>36b>36c). In order to make the currents flowing through the light emitting layer regions 35a, 35b, and 35c be the same, the power of the power supply P1, the power of the power supply P2 and the power of the power supply P3 are sequentially decreased (P1>P2>P3).

Figure 4A:
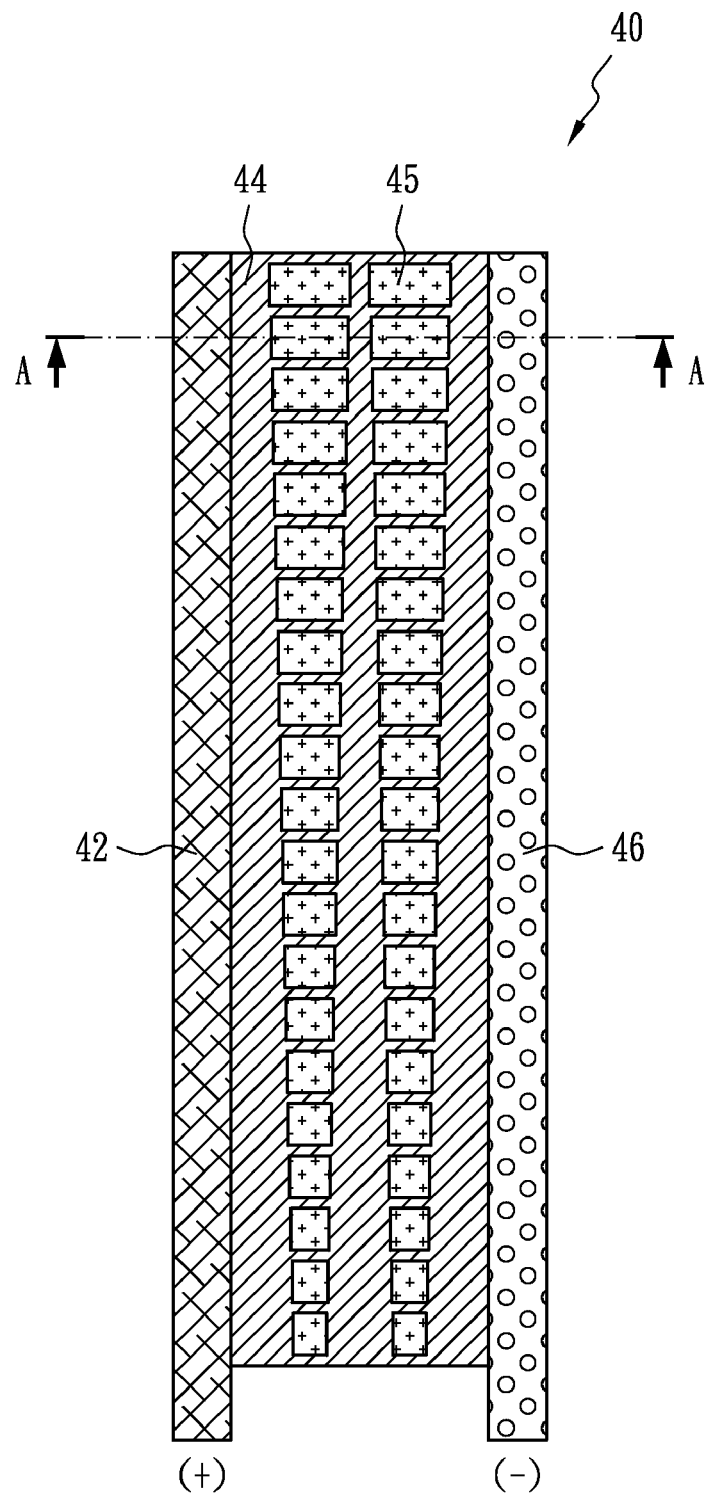
FIG. 4(a) is a schematic top view of the OLED device according to a third embodiment of the present invention.
Figure 4B:
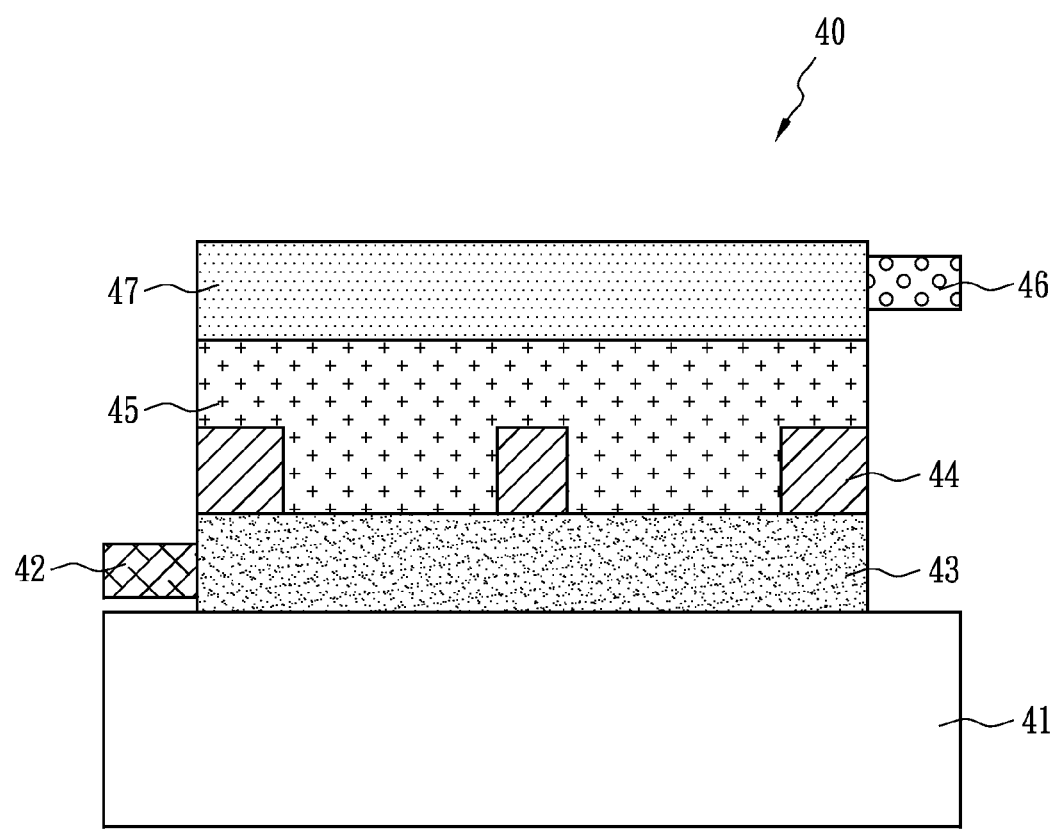
FIG. 4(b) is a cross-sectional view of the OLED device in FIG. 4(a)

FIG. 4(a) is a schematic top view of an OLED device 40 with brightness uniformity design in accordance with a third embodiment of the present invention. FIG. 4(b) is a cross-sectional view of the OLED device 40 in FIG. 4(a) taken along the section line A-A and rotated 180 degrees, so the transparent substrate 41 is at the lower part of the figure. Moreover, the anode layer 43 in FIG. 4(b) is also made of transparent materials, so it is not shown in FIG. 4(a).

As shown in FIG. 4(b), the OLED device 40 includes a substrate 41, an anode layer 43, a metal layer 44, a light emitting layer 45, a cathode layer 47, an anode wire 42 and a cathode wire 46. The anode layer 43 is formed on the substrate 41, the metal layer 44 is formed on the anode layer 43, the light emitting layer 45 is formed on the anode layer 43 and covers the metal layer 44, the cathode layer 47 is formed on the light emitting layer 45, the anode wire 42 is connected to the anode layer 43, and the cathode wire 46 is connected to the cathode layer 47.

As shown in FIG. 4(a), the metal layer 44 shades a part of the light emitting region for the light emitting layer 45, and causes the light emitting layer 45 to be formed into a plurality of effective light emitting regions. The brightness of the emitted lights is least (lights are less bright) at a region of the light emitting layer 45 which is farthest away from the positive and negative input terminals of the power supply, because the resistance of the lead that the current flows through is largest. The brightness of the emitted lights is greatest (lights are brightest) at the region of the light emitting layer 45 which is nearest to the positive and negative input terminals of the power supply, because the resistance of the lead that the current flows through is smallest. In order to cause the brightness of the emitted light for the light emitting layer 45 be uniform, the sizes of the plurality of effective light emitting regions are respectively made to be in direct proportion to the distances between the effective light emitting regions and the input terminal side of the power supply, such that the aperture ratio of the light emitting region is compensated at the region of the light emitting layer 45 relatively far away from the positive and negative input terminals of the power supply.

Figure 4C:
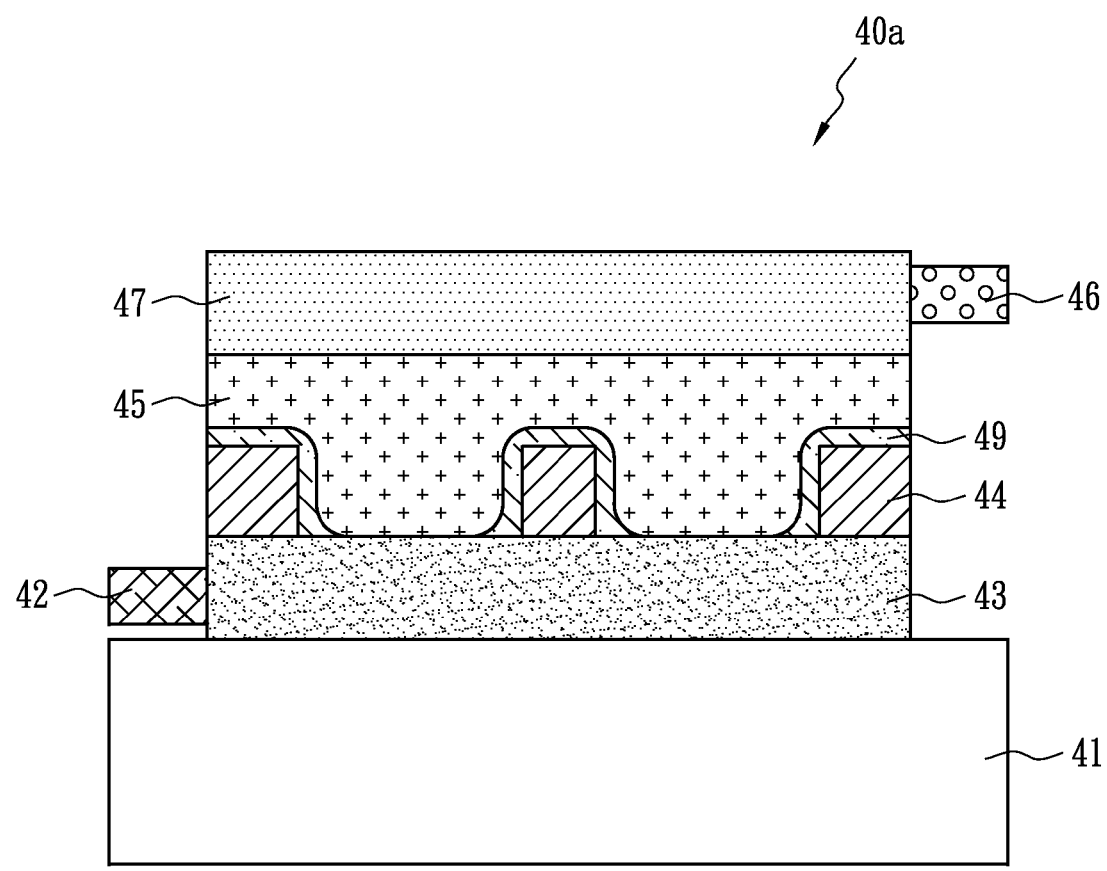
FIG. 4(c) is a cross-sectional view of the OLED device according to another embodiment of the present invention.

After the metal layer 44 is formed by etching, the sharp corners of the metal layer 44 may cause the film layer of the light emitting layer 45 to be discontinuous, and thereby result in an abnormal display. Accordingly, an insulating material layer 49 is overlaid on the metal layer 44 of the OLED device 40a, as shown in FIG. 4(c) so that the planarization result is obtained. Therefore, the discontinuousness of the plating layer of the light emitting layer 45 is improved.

The shapes of the effective light emitting region of the light emitting layer 45 are not limited to the plurality of squares in FIG. 4(a), and instead may be a plurality of polygons, regular areas or irregular areas, for example, a plurality of circles or a plurality of honeycomb-shaped areas.

Figure 5:
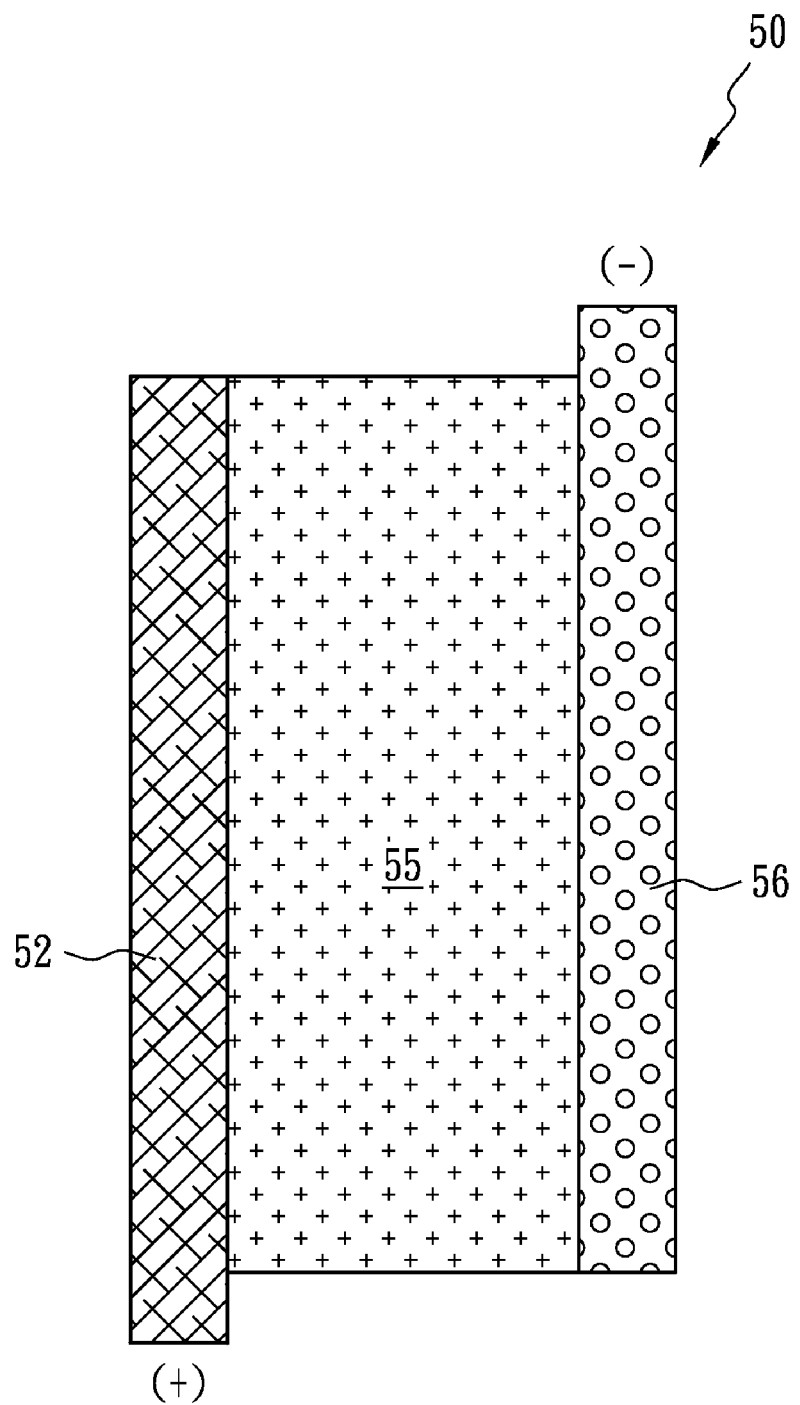
FIG. 5 is a schematic top view of the OLED device according to a fourth embodiment of the present invention.

FIG. 5 is a schematic top view of an OLED device 50 with brightness uniformity design in accordance with a fourth embodiment of the present invention. The anode lead 52 of the OLED device 50 is connected to a positive input terminal of a power supply, and the cathode lead 56 is connected to a negative input terminal of the power supply. This embodiment differs from the above embodiment in that the positive input terminal and the negative input terminal of the power supply are made to be respectively located on the diagonal and opposite edges, such that the resistance of the leads in different current paths can be the same, thus, the brightness of emitted lights for the light emitting layer 55 can be uniform.

The aforementioned descriptions of the present invention are intended to be illustrative only. Numerous alternative methods may be devised by persons skilled in the art without departing from the scope of the following claims.

What is claimed is:

1. An organic light emitting diode (OLED) device with brightness uniformity design, comprising:
a substrate;
an anode layer including a plurality of separated regions formed on the substrate respectively;
a light emitting layer including a plurality of separated regions formed on the regions of the anode layer respectively;
a cathode layer including a plurality of separated regions formed on the regions of the light emitting layer respectively;
a plurality of anode leads respectively connected to the regions of the anode layer; and
a plurality of cathode leads respectively connected to the regions of the cathode layer,
wherein one of the separated regions of the cathode layer is electrically connected to only one of the separated regions of the anode layer, and a pair of the separated regions of the cathode layer and the anode layer sandwich and control different one of the separated regions of the light emitting layer.

2. The OLED device with brightness uniformity design of claim 1, wherein cross-sectional areas of the anode leads are different from each other, and cross-sectional areas of the cathode leads are different from each other.

3. The OLED device with brightness uniformity design of claim 2, wherein the ratios of the lengths to the cross-sectional areas for the anode leads and cathode leads are the same.

4. The OLED device with brightness uniformity design of claim 2, wherein the anode leads are connected to a positive input terminal of a power supply, and the cathode leads are connected to a negative input terminal of the power supply.

5. The OLED device with brightness uniformity design of claim 1, wherein the cross-sectional areas of the anode leads are the same, and the cross-sectional areas of the cathode leads are the same.

6. The OLED device with brightness uniformity design of claim 5, wherein the anode leads are respectively connected to positive input terminals of a plurality of power supplies, and the cathode leads are respectively connected to negative input terminals of the plurality of power supplies.

7. The OLED device with brightness uniformity design of claim 6, wherein the power of the power supplies is in direct proportion to the lengths of either the anode leads or the cathode leads connected to the power supplies.

8. The OLED device with brightness uniformity design of claim 1, wherein the regions of the light emitting layer are separated by a plurality of insulating regions.

9. An OLED device with brightness uniformity design, comprising:
a substrate;
an anode layer formed on the substrate;
a metal layer formed on the anode layer;
a light emitting layer formed on the anode layer and covering the metal layer;
a cathode layer formed on the light emitting layer;
an anode lead connected to the anode layer; and
a cathode lead connected to the cathode layer;
wherein the metal layer shades a part of the light emitting layer, causing the light emitting layer to be formed into a plurality of effective light emitting regions, and the cross sectional area of the effective light emitting regions are in direct proportion to the distances between the effective light emitting regions and input terminals of a power supply.

10. The OLED device with brightness uniformity design of claim 9, further comprising an insulating layer covered on the metal layer.

11. The OLED device with brightness uniformity design of claim 9, wherein shapes of the effective light emitting regions are a plurality of polygons, regular areas or irregular areas.

12. The OLED device with brightness uniformity design of claim 11, wherein the shapes of the effective light emitting regions are a plurality of squares, a plurality of circles or a plurality of honeycomb-shaped areas.

* * * * *